(12) United States Patent
Andoh et al.

(10) Patent No.: US 6,472,247 B1
(45) Date of Patent: Oct. 29, 2002

(54) SOLID-STATE IMAGING DEVICE AND METHOD OF PRODUCTION OF THE SAME

(75) Inventors: Jun Andoh, Kanagawa (JP); Yoshihiro Morii, Kanagawa (JP); Toshio Kobayashi, Kanagawa (JP); Akio Yashiba, Kanagawa (JP); Hiroshi Takemoto, Tokyo (JP); Takeshi Sano, Kanagawa (JP); Tsutomu Sakatsu, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/886,990

(22) Filed: Jun. 25, 2001

(30) Foreign Application Priority Data

Jun. 26, 2000  (JP) .................................... 2000-190576
Jun. 26, 2000  (JP) .................................... 2000-190577

(51) Int. Cl.[7] ............................................... H01L 21/00
(52) U.S. Cl. ........................................................ 438/64
(58) Field of Search ........................... 438/64, 65–67, 438/89, 56–63; 257/432

(56) References Cited

U.S. PATENT DOCUMENTS

| 2,711,234 A | 6/1955 | Rubens ........................ 190/26 |
| 5,154,332 A | 10/1992 | Williams et al. ............ 224/153 |
| 5,172,795 A | 12/1992 | Riceman ...................... 190/26 |
| 5,254,868 A | * 10/1993 | Saito ........................... 257/432 |
| 5,743,447 A | 4/1998 | Mcdermott ................. 224/153 |
| 5,758,950 A | 6/1998 | Naoe et al. ................. 362/259 |
| D409,376 S | 5/1999 | Golenz et al. .............. D3/217 |
| 5,979,722 A | 11/1999 | Gonzales ..................... 224/153 |
| 5,997,153 A | 12/1999 | Naoe et al. ................. 362/259 |
| 6,179,445 B1 | 1/2001 | Naoe et al. ................. 362/259 |

FOREIGN PATENT DOCUMENTS

| JP | 5-175742 | 7/1993 |
| JP | 5-259420 | 10/1993 |
| JP | 6-204442 | 7/1994 |

* cited by examiner

*Primary Examiner*—Craig Thompson
(74) *Attorney, Agent, or Firm*—Oblon, Spivak, McClelland, Maier & Neustadt, P.C.

(57) ABSTRACT

In a solid-state imaging device and its production method according to the present invention, a solid-state image sensor has an effective light-receiving region on a circuit formation surface provided in a face-down condition. A transparent substrate has a conductor pattern provided thereon to confront the circuit formation surface of the image sensor. A transparent adhesive agent is provided between the image sensor and the substrate and formed into a thin layer, the adhesive agent covering the light-receiving region of the image sensor. A plurality of bumps are provided on one of the image sensor and the substrate to interconnect the image sensor and the conductor pattern of the substrate.

14 Claims, 7 Drawing Sheets

SOLID-STATE IMAGING DEVICE AND METHOD OF PRODUCTION OF THE SAME

BACKGROUND OF THE INVENTION

1. Field of the Invention

The present invention relates to solid-state imaging devices which read an image by using solid-state image sensors, and relates to semiconductor packaging techniques which are applicable to the production of solid-state imaging devices used in copiers, image scanners, facsimiles, digital cameras, video cameras or the like.

2. Description of the Related Art

Conventionally, the dominant method of production of solid-state imaging device is to produce a package that contains a solid-state image sensor, such as CCD (charge-coupled device), the package typically made of a ceramic insulating substrate.

Figure 6:
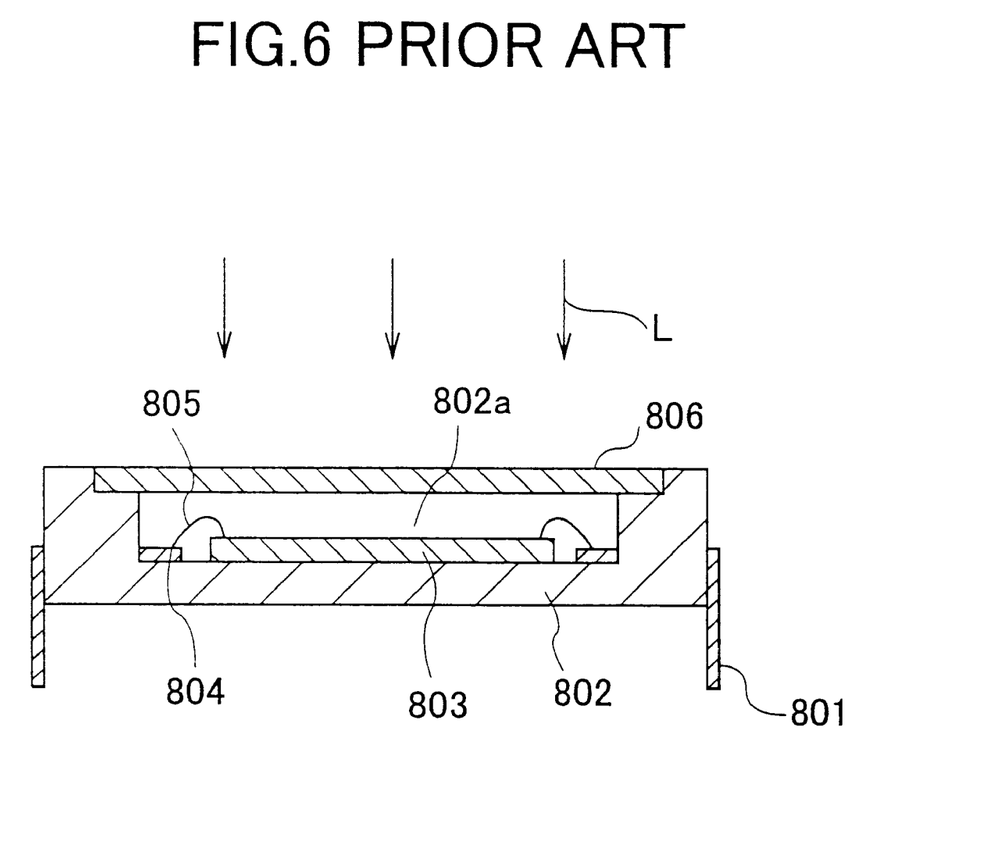
FIG. 6 is a cross-sectional view of a conventional solid-state imaging device.

FIG. 6 shows a conventional solid-state imaging device.

As shown in FIG. 6, the conventional solid-state imaging device includes a ceramic package 802 having a plurality of external terminals 801. The package 802 contains a solid-state image sensor 803, the package 802 being made of a ceramic insulating substrate. Hereinafter, the package itself (or the ceramic insulating substrate) will be referred to as the ceramic package. The external terminals 801 are provided for the solid-state imaging device to output an electrical signal to an external device via the external terminals 801.

The ceramic package 802 includes a recessed portion 802a at its upper surface, and the solid-state image sensor 803 is mounted on the recessed portion 802a of the ceramic package 802. The solid-state image sensor 803 has an effective light-receiving region, and the solid-state image sensor 803 is placed with this light-receiving region in a face-up condition.

In the recessed portion 802a of the ceramic package 802, electrodes 804, which are connected to the external terminals 801 in the ceramic package, are provided at internal peripheral locations of the recessed portion 802a. The solid-state image sensor 803 also includes electrodes at peripheral locations of the upper surface of the image sensor. By performing a wire bonding, the electrodes 804 of the ceramic package 802 are electrically connected to the electrodes of the image sensor 803 by wires 805. The wires 805 are made of, for example, aluminum (Al) or gold (Au). Further, in order to protect the solid-state image sensor 803, a silica glass 806 is attached to the top of the recessed portion 802a of the ceramic package 802 as a sealing cover for protecting the image sensor 803 from mechanical damage and environmental influences.

During an operation of the imaging device of FIG. 6, incident light 807, which is derived from an object to be imaged, passes through the silica glass 806 on the top of the recessed portion 802 of the ceramic package 802, and reaches the solid-state image sensor 803. The light-receiving region of the image sensor 803 for receiving the incident light 807 is formed with a large number of photodiodes (not shown). The number of photodiodes in one solid-state image sensor varies depending on the type of the image sensor, and the number of photodiodes in the image sensor 803 is typically in a range from 20,000 to 40,000. The image sensor 803 generates an electrical signal through the optoelectronic conversion of the received light, and the signal, output by the image sensor 803, is processed as image data in an image reading unit (not shown).

In the case of a recent solid-state image sensor in which a larger number of tiny photodiodes are more densely provided, a micro-lens of a resin material is additionally formed on the light-receiving region of the image sensor for the purpose of increasing the sensitivity of the photodiodes to receiving light. In such a case, the incident light 807 passes through the silica glass 806, and it is converted by the micro-lens into a convergent light, so that the convergent light reaches the light-receiving region of the solid-state image sensor 803. Similarly, the image sensor 803 generates an electrical signal through the optoelectronic conversion of the received light, and the signal, output by the image sensor 803, is processed as image data in an image reading unit.

Figure 7A:
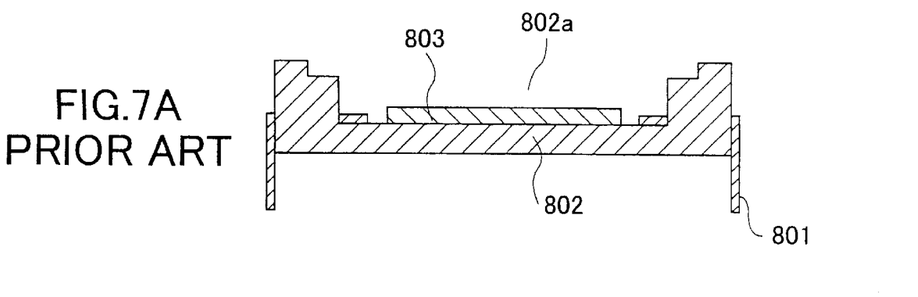
FIG. 7A, FIG. 7B and FIG. 7C are diagrams for explaining a conventional method of production of the solid-state imaging device.
Figure 7B:
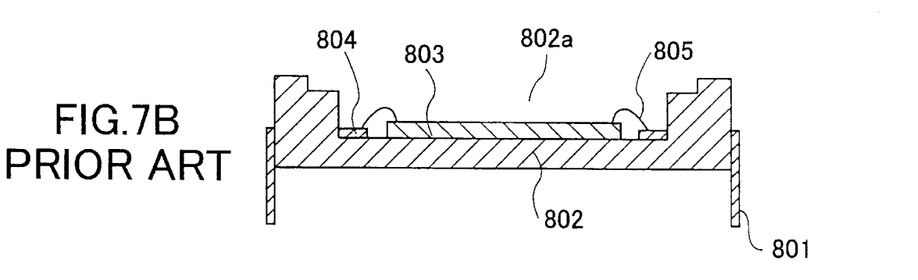
Figure 7C:
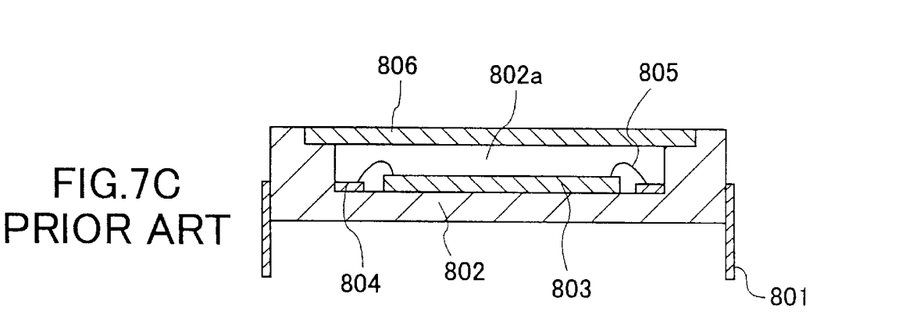

FIG. 7A, FIG. 7B and FIG. 7C show a conventional method of production of the solid-state imaging device shown in FIG. 6.

In a first step of the production method of the solid-state imaging device, the die bonding process as shown in FIG. 7A is performed. The solid-state image sensor 803 is placed into the recessed portion 802a of the ceramic package 802 with the light-receiving region of the image sensor 803 in a face-up condition. The ceramic package 802 is provided with the external terminals 801. The image sensor 803 is bonded to the ceramic package 802 by using a die bonding machine. The die bonding process to bond the image sensor 803 onto the ceramic package 802 is performed by using a conductive adhesive agent, such as a thermosetting silver paste. The curing of the conductive adhesive agent, which is provided between the image sensor 803 and the ceramic package 802, is attained by heating it to about 150 deg. C.

In a second step, the interconnecting process as shown in FIG. 7B is performed after the end of the die bonding process. The electrodes 804 at the internal peripheral locations of the recessed portion 802a are electrically connected to the electrodes at the peripheral locations of the upper surface of the image sensor 803 by the wires 805 of aluminum or gold. The interconnecting process to interconnect these electrodes is performed by using a wire bonding machine. The electrodes 804 are respectively connected to the external terminals 801 in the ceramic package 802.

In a third step, the encapsulation process as shown in FIG. 7C is performed after the end of the interconnecting process. The silica glass 806 is attached to the top of the recessed portion 802a of the ceramic package 802 as a sealing cover that protects the image sensor 803 from mechanical damage and environmental influences. The conventional imaging device is thus produced. When the silica glass 806 is attached to the ceramic package 802 as the sealing cover, it is necessary to maintain the internal space between the silica glass 806 and the ceramic package 802 in a vacuum condition before and after the encapsulation process. The silica glass 806 must be bonded to the ceramic package 802 under a vacuum condition, and the bonding process to bond the silica glass 806 to the ceramic package 802 is performed by using a thermosetting adhesive agent.

In the above-described solid-state imaging device, the electrical connections of the package electrodes 804 and the image sensor electrodes are established by the wires 805. In order to arrange the wires 805 at the peripheral locations of the upper surface of the image sensor 803 where the electrodes are provided, the ceramic package 802 requires a relatively wide area to form the electrodes 804 at the internal peripheral locations of the recessed portion 802a. Further, the internal space between the image sensor 803 and the silica glass 806 must be wide enough to accommodate the looped portions of the wires 805 therein. Therefore, it is difficult to develop a small-size, light-weight imaging device based on the structure of the conventional imaging device.

SUMMARY OF THE INVENTION

An object of the present invention is to provide an improved solid-state imaging device in which the above-described problems are eliminated.

Another object of the present invention is to provide a solid-state imaging device which not only provides small-size, lightweight features but also provides reliable protection of the imaging performance against mechanical damage and environmental influences.

Another object of the present invention is to provide a method of production of a solid-state imaging device which not only provides small-size, light-weight features but also provides reliable protection of the imaging performance against mechanical damage and environmental influences.

The above-mentioned objects of the present invention are achieved by a solid-state imaging device comprising: a solid-state image sensor which has an effective light-receiving region on a circuit formation surface provided in a face-down condition; a transparent substrate which has a conductor pattern provided thereon to confront the circuit formation surface of the image sensor; a transparent adhesive agent which is provided between the image sensor and the substrate and formed into a thin layer, the adhesive agent covering the light-receiving region of the image sensor; and a plurality of bumps which are provided on one of the image sensor and the substrate to interconnect the image sensor and the conductor pattern of the substrate.

The above-mentioned objects of the present invention are achieved by a method of production of a solid-state imaging device comprising the steps of: providing a solid-state image sensor having an effective light-receiving region on a circuit formation surface provided in a face-down condition; providing a transparent substrate having a conductor pattern provided thereon to confront the circuit formation surface of the image sensor; providing a plurality of bumps on one of the image sensor and the substrate; supplying a predetermined amount of a transparent adhesive agent between the image sensor and the substrate, the amount of the adhesive agent being large enough to fully cover the light-receiving region of the image sensor; moving the image sensor closer to the substrate until a predetermined distance between the image sensor and the substrate is reached, so that the bumps interconnect the image sensor and the conductor pattern of the substrate; forming the adhesive agent between the image sensor and the substrate into a thin layer, the thin layer of the adhesive agent covering the light-receiving region of the image sensor; and curing the adhesive agent.

In the solid-state imaging device and the production method according to the present invention, the circuit formation surface of the image sensor having the effective light-receiving region thereon is provided in a face-down condition, and the conductor pattern of the substrate is provided to confront the circuit formation surface of the image sensor. The transparent adhesive agent is provided between the image sensor and the substrate and formed into a thin layer, the adhesive agent covering the light-receiving region of the image sensor. Therefore, the solid-state imaging device and the production method of the present invention not only provide small-size, light-weight features but also provides reliable protection of the imaging performance against mechanical damage and environmental influences. Further, the production method of the present invention is useful and effective in easy and low-cost production of the solid-state imaging device that provides small-size, light-weight features as well as reliable protection of the imaging performance against mechanical damage and environmental influences.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be provided of preferred embodiments of the present invention with reference to the accompanying drawings.

Figure 1A:
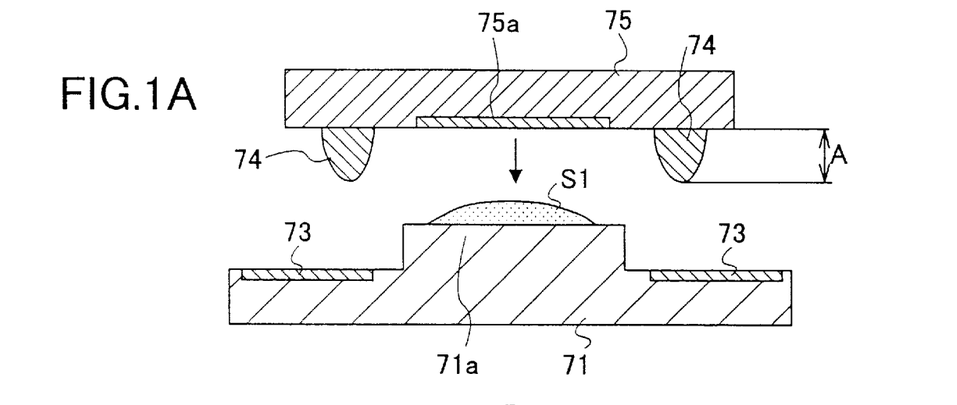
FIG. 1A, FIG. 1B and FIG. 1C are diagrams for explaining a method of production of the solid-state imaging device according to a first preferred embodiment of the present invention.
Figure 1B:
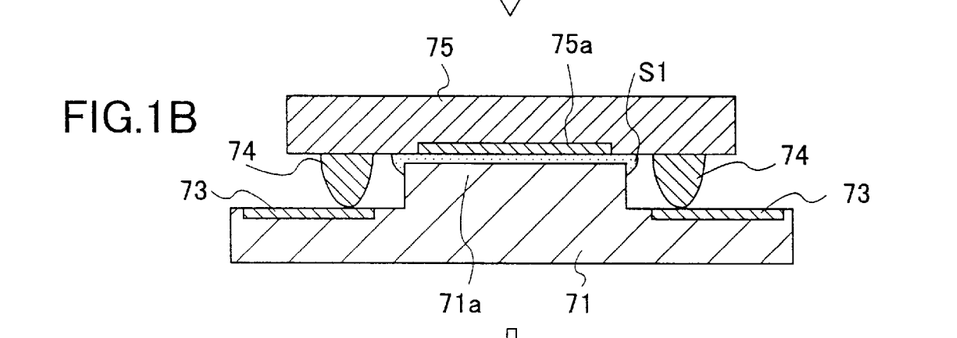
Figure 1C:
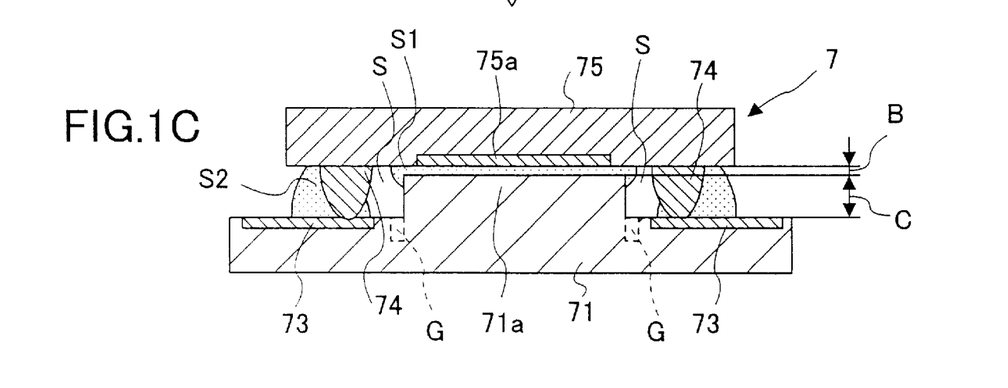

FIG. 1A, FIG. 1B and FIG. 1C are diagrams for explaining a method of production of the solid-state imaging device according to a first preferred embodiment of the present invention.

As shown in FIG. 1C, the solid-state imaging device 7 of the present embodiment includes a CCD bare chip 75 which serves as the solid-state image sensor described above and has an effective light-receiving region 75a on a circuit formation surface provided in a face-down condition. In the CCD bare chip 75, an integrated circuit, including a line CCD and an area CCD, is provided on the circuit formation surface of the bare chip to generate an electrical signal through the optoelectronic conversion of the received light, which is received at the light-receiving region 75a and carries image information of the incident light derived from an object to be imaged.

The effective light-receiving region 75a of the CCD bare chip 75 in the present embodiment means a region of the solid-state image sensor wherein a photocell array is provided. The photocell array is an array of photocells that receive the incident light and provide an electrical output from the incident light.

Figure 3:
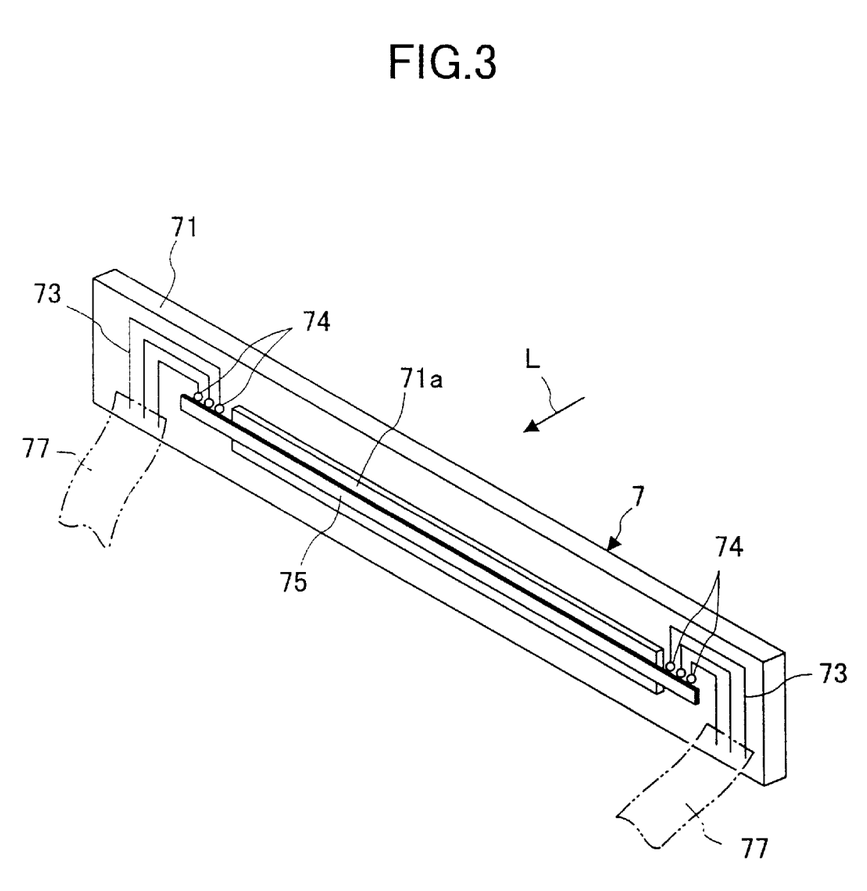
FIG. 3 is a perspective view of the solid-state imaging device shown in FIG. 1C.

The solid-state imaging device 7 includes a transparent glass substrate 71 which has a conductor pattern 73 provided thereon to confront the circuit formation surface of the CCD bare chip 75. The conductor pattern 73 is provided to interconnect the integrated circuit of the CCD bare chip 75 and flexible printed circuit cables FPC 77 (which are indicated in FIG. 3). The imaging device 7 is connected to an external device via the FPC 77.

The solid-state imaging device 7 includes a transparent adhesive agent S1 which is filled between the CCD bare chip 75 and the glass substrate 71 and formed into a thin layer, the adhesive agent S1 covering the light-receiving region 75a of the bare chip 75.

The solid-state imaging device 7 further includes a plurality of bumps 74 which are provided on the circuit formation surface of the CCD bare chip 75 to interconnect the CCD bare chip 75 and the conductor pattern 73 of the glass substrate 71.

In the above-described embodiment, the bumps 74 are provided on the circuit formation surface of the CCD bare chip 75. Alternatively, the bumps 74 may be provided on the glass substrate 71, rather than on the CCD bare chip 75. In such alternative embodiment, the bumps 74 are electrically connected to respective ends of the conductor pattern 73.

The CCD bare chip 75 is produced from a silicon wafer on which the integrated circuit is made. The wafer is cut into chips with a desired size, and the CCD bare chip 75 is thus produced. The CCD bare chip 75 requires adequate flatness of the circuit formation surface after the packaging. The cutting of the silicon wafer into chips is performed so as to meet the required flatness of the circuit formation surface. The CCD bare chip 75 must be packaged so that it is protected from mechanical damage and environmental influences, such as dust or dew.

The glass substrate 71 includes a raised portion 71a on the surface of the glass substrate where the conductor pattern 73 is provided. The raised portion 71a is provided to confront the effective light-receiving region 75a of the CCD bare chip 75. In the glass substrate 71, the raised portion 71a has a height "C" (indicated in FIG. 1C) above the conductor pattern 73. The raised portion 71a covers an effective light-receiving region of the glass substrate 71 corresponding to the light-receiving region 75a of the CCD bare chip 75, and has a sufficiently large surface area so as not to avoid the entry of the incident light into the light-receiving region 75a of the CCD bare chip.

The glass substrate 71 is made from a high-transmittance material. In the glass substrate 71, the top surface of the raised portion 71a, which contacts or is bonded to the light-receiving region 75a of the CCD bare chip 75, is formed so as to meet the flatness that is equivalent to the required flatness of the circuit formation surface of the CCD bare chip 75.

In the above-described embodiment, the glass substrate 71 is provided as the transparent glass substrate. Alternatively, the substrate 71 may be made of another high-transmittance material different from a glass material, such as a plastic material oriented for lenses.

The bumps 74 are provided to interconnect the CCD bare chip 75 and the conductor pattern 73 of the glass substrate 71. The bumps 74 in the present embodiment are formed on the bare chip 75 by using the flip-chip technique. For the purpose of easy interconnection of the bare chip 75 and the conductor pattern 73, the bumps 74 are provided in the form of projections on the circuit formation surface of the bare chip 75. Alternatively, the bumps 74 may be provided on the conductor pattern of the glass substrate 71. In the present embodiment, the bumps 74 are configured to have a height "A" (indicated in FIG. 1A) above the circuit formation surface of the CCD bare chip 75, the height A being larger than the sum of a thickness "B" (indicated in FIG. 1C) of the adhesive agent S1 and the height "C" of the raised portion 71a of the glass substrate 71. By this configuration, the interconnection of the CCD bare chip 75 and the conductor pattern 73 can be easily and reliably attained, and the orientation of the light-receiving region of the CCD bare chip 75 relative to the glass substrate 71 can be suitably set.

Further, in the solid-state imaging device 7 of the present embodiment, a sealing resin S2 is provided at the outer locations of the bumps 74 between the CCD bare chip 75 and the glass substrate 71. The material of the sealing resin S may be either the same as that of the adhesive agent S1 or different from that of the adhesive agent S1. That is, the sealing resin S may be transparent but the transparency of the sealing resin S2 is not necessarily required. In the present embodiment, the sealing resin S2 is made of an opaque resin material. When the opaque sealing resin S2 is used at the outer locations of the bumps 74 between the CCD bare chip 75 and the glass substrate 71, the incidence of undesired light rays to the light-receiving region 75a of the CCD bare chip 75 in a sidewise manner can be prevented. This helps increase the quality of an image created by an image reading unit which uses the solid-state imaging device 7 of the present embodiment. It is preferred to use the sealing resin S2 that has a relatively small thermal expansion coefficient.

In the present embodiment, the adhesive agent S1 serves not only to fix the CCD bare chip 75 but also to encapsulate the effective light-receiving region 75a. The imaging device 7 is configured such that the amount of the adhesive agent S1 provided between the CCD bare chip 75 and the glass substrate 71 is larger than a volume defined by the product of the thickness B of the adhesive agent S1 and the surface area of the light-receiving region 75a. By this configuration, the adhesive agent S1 fully covers the light-receiving region 75a of the CCD bare chip 75, and the inclusion of bubbles in the layer of the adhesive agent S1 can be prevented.

In the present embodiment, the transparent adhesive agent S1 used is a UV-curing adhesive agent that remains transparent after the curing. Alternatively, the material of the adhesive agent S1 may be an optically curing adhesive agent if it remains transparent even after the curing. Examples of the transparent adhesive agent S1 include balsam, an epoxy-based resin, a fluorine-based resin, silicon, and so on.

A description will now be given of the production method of the solid-state imaging device 7 of the present embodiment with reference to FIG. 1A through FIG. 1C.

As shown in FIG. 1A, in a first step of the production method of the solid-state imaging device 7, the CCD bare chip 75 is placed, with the light-receiving region 75a on the circuit formation surface provided in a face-down condition, adjacent to the glass substrate 71 such that the circuit formation surface of the bare chip confronts the surface of the glass substrate 71 on which the conductor pattern 73 is provided. In the first step, the CCD bare chip 75 is already provided with the bumps 74 on the circuit formation surface thereof while the glass substrate 71 is already provided with the conductor pattern 73 thereon.

In the first step, after the CCD bare chip 75 is placed adjacent the glass substrate 71, a predetermined amount of the adhesive agent S1 is supplied to the top surface of the raised portion 71a of the glass substrate 71. The amount of the adhesive agent S1 supplied at this time is the amount needed to fully cover the light-receiving region 75a of the CCD bare chip 75. Specifically, the amount of the adhesive agent S1 is slightly larger than a volume defined by the product of the thickness B of the adhesive agent S1 and the surface area of the light-receiving region 75a. The purpose of this is to create an internal space (indicated by "S" in FIG. 1C) between the thin layer of the adhesive agent S1, the raised portion 71a of the glass substrate 71 and the bumps 94 of the bare chip 75.

In an alternative embodiment of the production method of the invention, an annular grooved portion G, surrounding the periphery of the raised portion 71a of the glass substrate 71, may be formed as indicated by the dotted lines in FIG. 1C. By this configuration, the annular grooved portion G serves to receive an exceeding amount of the adhesive agent S1, if any. According to this alternative embodiment, it is possible to ensure that the internal space S between the thin layer of the adhesive agent S1, the raised portion 71a of the glass substrate 71 and the bumps 94 of the bare chip 75 is created.

As shown in FIG. 1B, in a second step, the CCD bare chip 75 is moved closer to the glass substrate 71 until a predetermined distance between the chip and the substrate is reached, such that the CCD bare chip 75 is bonded to the glass substrate 71 by the adhesive agent S1, and the bumps 74 interconnect the CCD bare chip 75 and the conductor pattern 73 of the glass substrate 71. The adhesive agent S1 between the CCD bare chip 75 and the glass substrate 71 is formed into a thin layer and fully covers the light-receiving region 75a of the bare chip 75. When moving the CCD bare chip 75 closer to the glass substrate 71, pressure is exerted on the adhesive agent S1 on the glass substrate 71 such that the adhesive agent S1 is uniformly dispersed over the light-receiving region 75a.

As shown in FIG. 1C, in a third step, the adhesive agent S1 is irradiated with UV (ultra-violet) rays to attain the curing of the adhesive agent S1. Further, the sealing resin S2 is supplied to the outer locations of the bumps 74 between the CCD bare chip 75 and the glass substrate 71. That is, the entire periphery of the light-receiving region 75a of the CCD bare chip 75 surrounded by the bumps 74 is completely encapsulated with the sealing resin S2. Finally, the curing of the sealing resin S2 supplied is attained by an appropriate method.

In the above-described production method, the supplying of the adhesive agent S1 to the raised portion 71a of the glass substrate 71 is performed prior to the movement of the CCD bare chip 75 to the predetermined distance from the glass substrate 71 as shown in FIG. 1A. However, the production method of the present invention is not limited to this embodiment. Alternatively, the movement of the CCD bare chip 75 to the predetermined distance from the glass substrate 71 may be performed earlier than the supplying of the adhesive agent S1 to the raised portion 71a of the glass substrate 71. In such alternative embodiment, the predetermined amount of the adhesive agent S is supplied to the internal space between the CCD bare chip 75 and the raised portion 71a of the glass substrate 71 which are set at the predetermined distance.

FIG. 3 is a perspective view of the solid-state imaging device 7 shown in FIG. 1C. As shown in FIG. 3, the solid-state imaging device 7 of the present embodiment is thus produced through the production method described above. In FIG. 3, reference numeral 77 denotes the flexible printed circuit cables FPC. The cables 77 are attached to the conductor pattern 73 of the imaging device 7 in order to connect the imaging device 7 to an external device. The arrow L in FIG. 3 indicates the incident light which is derived from a focusing lens (not shown).

Figure 2A:
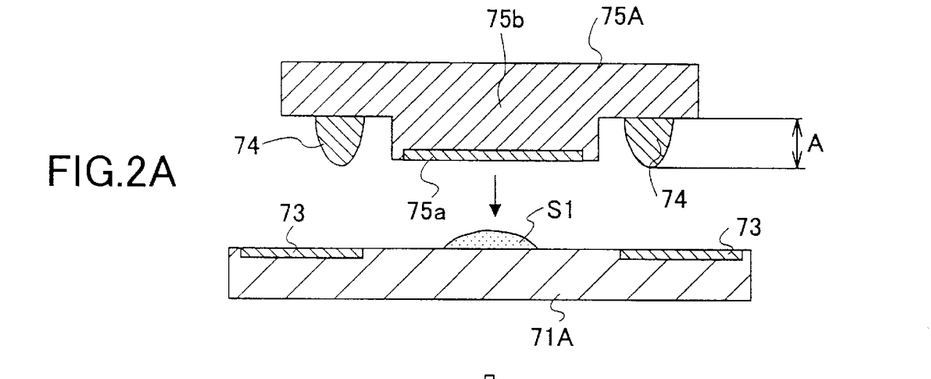
FIG. 2A, FIG. 2B and FIG. 2C are diagrams for explaining a method of production of the solid-state imaging device according to a second preferred embodiment of the present invention.
Figure 2B:
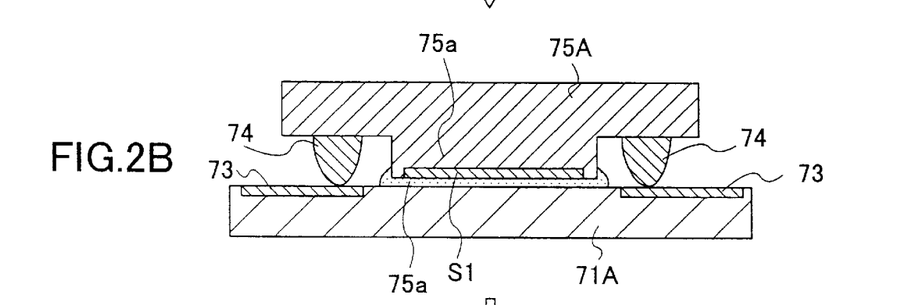
Figure 2C:
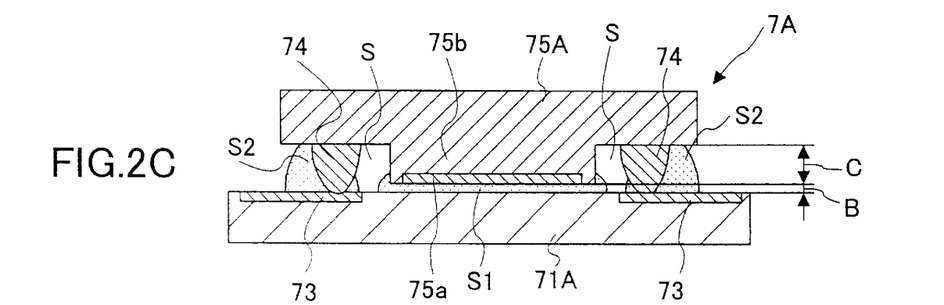

Next, FIG. 2A, FIG. 2B and FIG. 2C are diagrams for explaining a method of production of the solid-state imaging device according to a second preferred embodiment of the present invention.

In the present embodiment of FIG. 2C, the elements which are essentially the same as corresponding elements in the previous embodiment of FIG. 1C are designated by the same reference numerals.

As shown in FIG. 2C, the solid-state imaging device 7A of the present embodiment includes a CCD bare chip 75A which serves as the solid-state image sensor and has the effective light-receiving region 75a on the circuit formation surface provided in a face-down condition. In the CCD bare chip 75A, an integrated circuit, including a line CCD and an area CCD, is provided on the circuit formation surface of the bare chip to generate an electrical signal through the optoelectronic conversion of the received light, which is received at the light-receiving region 75a and carries image information of the incident light derived from an object to be imaged.

The effective light-receiving region 75a of the CCD bare chip 75A in the present embodiment means a region of the solid-state image sensor wherein a photocell array is provided. The photocell array is an array of photocells that receive the incident light and provide an electrical output from the incident light.

The solid-state imaging device 7A includes a transparent glass substrate 71A having the conductor pattern 73 provided thereon to confront the circuit formation surface of the CCD bare chip 75A. The conductor pattern 73 is provided to interconnect the integrated circuit of the CCD bare chip 75A and the flexible printed circuit cables FPC 77 similar to those shown in FIG. 3.

The solid-state imaging device 7A includes the transparent adhesive agent S1 which is filled between the CCD bare chip 75A and the glass substrate 71A and formed into a thin layer, the adhesive agent S1 covering the light-receiving region 75a of the bare chip 75A.

The solid-state imaging device 7A further includes the bumps 74 which are provided on the circuit formation surface of the CCD bare chip 75A to interconnect the CCD bare chip 75A and the conductor pattern 73 of the glass substrate 71A.

In the above-described embodiment, the bumps 74 are provided on the circuit formation surface of the CCD bare chip 75A. Alternatively, the bumps 74 may be provided on the conductor pattern 73 of the glass substrate 71A, rather than on the CCD bare chip 75A. In such alternative embodiment, the bumps 74 are electrically connected to respective ends of the conductor pattern 73 of the glass substrate 71A.

The CCD bare chip 75A is produced from a silicon wafer on which the integrated circuit is made. The wafer is cut into chips with a desired size, and the CCD bare chip 75A is thus produced. The CCD bare chip 75A requires a surface flatness adequate for the circuit formation surface after the packaging. The cutting of the silicon wafer into chips is performed so as to meet the required flatness of the circuit formation surface. The CCD bare chip 75A must be packaged so that it is protected from mechanical damage and environmental influences, such as dust or dew.

The CCD bare chip 75A includes a raised portion 75b on the circuit formation surface of the bare chip, the raised portion 75b having a height "C" (indicated in FIG. 2C) above the circuit formation surface. In the CCD bare chip 75A, the raised portion 75b is provided to confront the glass substrate 71A, and the effective light-receiving region 75a is provided on the bottom surface of the raised portion 75b. The raised portion 75b has a large surface area enough to allow the entry of the incident light into the light-receiving region 75a of the CCD bare chip 75A without interference.

The glass substrate 71A is made from a high-transmittance material. The top surface of the glass substrate 71A contacts or is bonded to the light-receiving region 75a of the CCD bare chip 75A, and this top surface is formed so as to meet the flatness that is equivalent to the required flatness of the circuit formation surface of the CCD bare chip 75A.

In the above-described embodiment, the glass substrate 71A is provided as the transparent glass substrate. Alternatively, the substrate 71A may be made of another high-transmittance material different from a glass material, such as a plastic material oriented for lenses.

The bumps 74 are provided to interconnect the CCD bare chip 75A and the conductor pattern 73 of the glass substrate 71A. The bumps 74 in the present embodiment are formed on the bare chip 75A by using the flip-chip technique. For the purpose of easy interconnection of the bare chip 75A and the conductor pattern 73, the bumps 74 are provided in the form of projections on the circuit formation surface of the bare chip 75A. Alternatively, the bumps 74 may be provided on the conductor pattern 73 of the glass substrate 71A. In the present embodiment, the bumps 74 are configured to have a height "A" (indicated in FIG. 2A) above the circuit formation surface of the CCD bare chip 75A, the height A being larger than the sum of a thickness "B" (indicated in FIG. 2C) of the adhesive agent S1 and the height "C" of the raised portion 75b of the bare chip 75A. By this configuration, the interconnection of the CCD bare chip 75A and the conductor pattern 73 can be easily and reliably attained, and the orientation of the light-receiving region of the CCD bare chip 75A relative to the glass substrate 71A can be suitably set.

Further, in the solid-state imaging device 7A of the present embodiment, the sealing resin S2 is provided at the outer locations of the bumps 74 between the CCD bare chip 75A and the glass substrate 71A. The material of the sealing resin S may be either the same as that of the adhesive agent S1 or different from that of the adhesive agent S1. That is, the sealing resin S may be transparent but the transparency of the sealing resin S2 is not necessarily required. In the present embodiment, the sealing resin S2 is made of an opaque resin material. When the opaque sealing resin S2 is used at the outer locations of the bumps 74 between the CCD bare chip 75A and the glass substrate 71A, the incidence of undesired light rays to the light-receiving region 75a of the CCD bare chip 75A in a sidewise manner can be prevented. This helps increase the quality of an image created by an image reading unit which uses the solid-state imaging device 7A of the present embodiment. It is preferred to use the sealing resin S2 that has a relatively small thermal expansion coefficient.

In the present embodiment, the adhesive agent S1 serves not A only to fix the CCD bare chip 75A but also to encapsulate the effective light-receiving region 75a. The imaging device 7A is configured such that the amount of the adhesive agent S1 provided between the CCD bare chip 75A and the glass substrate 71A is larger than a volume defined by the product of the thickness B of the adhesive agent S1 and the area of the light-receiving region 75a. By this configuration, the adhesive agent S1 fully covers the light-receiving region 75a of the CCD bare chip 75A, and the inclusion of bubbles in the layer of the adhesive agent S1 can be prevented.

In the present embodiment, the transparent adhesive agent S1 used is a UV-curing adhesive agent that remains transparent after the curing. Alternatively, the material of the adhesive agent S1 may be an optically curing adhesive agent if it remains transparent even after the curing. Examples of the transparent adhesive agent S1 include balsam, an epoxy-based resin, a fluorine-based resin, silicon, and so on.

A description will now be given of the production method of the solid-state imaging device 7A of the present embodiment with reference to FIG. 2A through FIG. 2C.

As shown in FIG. 2A, in a first step of the production method of the solid-state imaging device 7A, the CCD bare chip 75A is placed, with the light-receiving region 75a on the circuit formation surface provided in a face-down condition, adjacent to the glass substrate 71A such that the circuit formation surface of the bare chip confronts the surface of the glass substrate 71A on which the conductor pattern 73 is provided. In the first step, the CCD bare chip 75A is already provided with the bumps 74 on the circuit formation surface thereof while the glass substrate 71A is provided with the conductor pattern 73 thereon.

In the first step, after the CCD bare chip 75A is placed adjacent the glass substrate 71A, a predetermined amount of the adhesive agent S1 is supplied to the top surface of the glass substrate 71. The amount of the adhesive agent S1 supplied at this time is the amount needed to fully cover the light-receiving region 75a of the CCD bare chip 75A. Specifically, the amount of the adhesive agent S1 is slightly larger than a volume defined by the product of the thickness B of the adhesive agent S1 and the surface area of the light-receiving region 75a. The purpose of this is to create an internal space (indicated by "S" in FIG. 2C) between the thin layer of the adhesive agent S1, the raised portion 75b of the bare chip 75A and the bumps 94 of the bare chip 75A.

In an alternative embodiment of the production method of the invention, an annular grooved portion, between the portion of the glass substrate 71A, corresponding to the periphery of the raised portion 75b of the bare chip 75A, and the bumps 74, may be formed. By this configuration, the annular grooved portion serves to receive an exceeding amount of the adhesive agent S1, if any. According to this alternative embodiment, it is possible to ensure that the internal space S between the thin layer of the adhesive agent S1, the raised portion 75b of the bare chip 75A and the bumps 94 of the bare chip 75A is created.

As shown in FIG. 2B, in a second step, the CCD bare chip 75A is moved closer to the glass substrate 71A until a predetermined distance between the chip and the substrate is reached, such that the CCD bare chip 75A is bonded to the glass substrate 71A by the adhesive agent S1, and the bumps 74 interconnect the CCD bare chip 75A and the conductor pattern 73 of the glass substrate 71A. The adhesive agent S1 between the CCD bare chip 75A and the glass substrate 71A is formed into a thin layer and fully covers the light-receiving region 75a of the bare chip 75A. When moving the CCD bare chip 75A closer to the glass substrate 71A, pressure is exerted on the adhesive agent S1 on the glass substrate 71A such that the adhesive agent S1 is uniformly dispersed over the light-receiving region 75a.

As shown in FIG. 2C, in a third step, the adhesive agent S1 is irradiated with UV rays to attain the curing of the adhesive agent S1. Further, the sealing resin S2 is supplied to the outer locations of the bumps 74 between the CCD bare chip 75A and the glass substrate 71A. That is, the entire periphery of the light-receiving region 75a of the CCD bare chip 75A surrounded by the bumps 74 is completely encapsulated with the sealing resin S2. Finally, the curing of the sealing resin S2 supplied is attained by an appropriate method.

In the above-described production method, the supplying of the adhesive agent S1 to the glass substrate 71 is performed prior to the movement of the CCD bare chip 75 to the predetermined distance from the glass substrate 71 as shown in FIG. 2A. However, the production method of the present invention is not limited to this embodiment. Alternatively, the movement of the CCD bare chip 75 to the predetermined distance from the glass substrate 71 may be performed earlier than the supplying of the adhesive agent S1 to the glass substrate 71. In such alternative embodiment, the predetermined amount of the adhesive agent S is supplied to the internal space between the raised portion 75a of the CCD bare chip 75 and the glass substrate 71 which are set at the predetermined distance.

Figure 4:
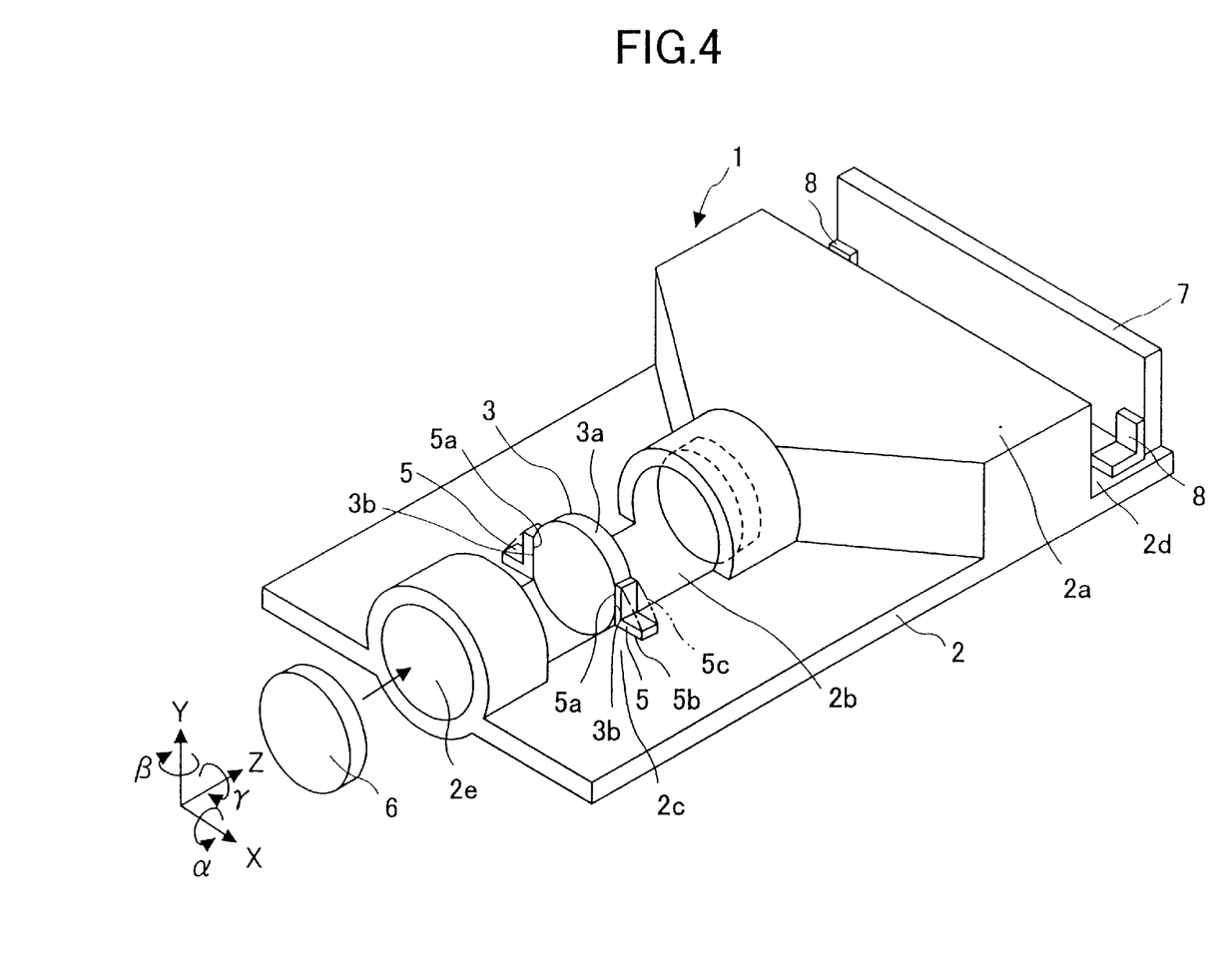
FIG. 4 is a perspective view of an image reading unit in which one embodiment of the solid-state imaging device of the invention is provided.

Next, FIG. 4 shows an image reading unit in which one embodiment of the solid-state imaging device of the invention is provided.

As shown in FIG. 4, the image reading unit 1 of the present embodiment generally includes a housing 2, a first lens 3, a pair of intermediate retainers 5, a second lens 6, and the solid-state imaging device 7. In the image reading unit 1, the solid-state imaging device 7, which is one embodiment of the present invention, is provided to generate an electrical signal through the optoelectronic conversion of the received light.

In the image reading unit 1 of FIG. 4, the housing 2 includes a shading cover portion 2a, a cylindrical groove portion 2b, a lens mounting surface 2c, an imaging-device mounting surface 2d, and a lens holder portion 2e. After the positioning of the lens 3 and the imaging device 7 on the housing 2 is performed, the housing 2 is secured to an image forming system (not shown) by using a suitable fixing method (bolting, caulking, bonding, welding or the like), while the positional relationship between the lens 3 and the imaging device 7 is maintained. The lens 3 is fixed to the lens mounting surface 2c of the housing 2 via the intermediate retainers 5. The imaging device 7 is fixed to the imaging-device mounting surface 2d of the housing 2. The lens 6 is fixed to the lens holder portion 2e of the housing 2. The first and second lenses 3 and 6 form a focusing lens in the image reading unit 1. The shading cover portion 2a of the housing 2 protects the focusing light sent from the lens 3 to the imaging device 7 from being interfered with an external light.

The position and orientation of the first lens 3 relative to the housing 2 are finely adjusted, and the first lens 3 is bonded to the housing 2 via the intermediate retainers 5 by using an adhesive agent. The first lens 3 includes a main lens surface which the incident light passes through, a circumferential side surface 3a corresponding to an upper portion of the periphery of the main lens surface, and two opposing flat surfaces 3b extending from ends of the circumferential side surface 3a. By the configuration of the flat surfaces 3b of the lens 3, the bonding areas between the lens 3 and the intermediate retainers 5 can be increased, and the fixing strength of the housing 2 can be increased.

Each of the intermediate retainers 5 includes a first mounting surface 5a and a second mounting surface 5b which are at right angles to each other. The first mounting surfaces 5a are attached to the flat surfaces 3b of the lens 3, and the second mounting surfaces 5b are attached to the lens mounting surface 2c of the housing 2.

In the present embodiment, the intermediate retainers 5 are made of a high-transmittance material, such as polycarbonate or the like. During the positioning of the lens 3 to the housing 2, the intermediate retainers 5 are movable relative to the housing 2 on the second mounting surfaces 5b because of the surface tension of the adhesive agent. Hence, the adjustment of the intermediate retainers S can follow the positioning of the lens 3.

As shown in FIG. 4, the attachment of the first mounting surfaces 5a of the intermediate retainers 5 to the flat surfaces 3b of the lens 3 makes it possible to reduce the influences due to the shrinkage of the adhesive agent during the curing.

As shown in FIG. 4, for each of the intermediate. retainers 5, a transparent triangular rib 5c may be provided between the first and second mounting surfaces 5a and 5b. By this configuration, the mechanical strength of the intermediate retainers 5 can be increased while the irradiation of light to an optically curing adhesive agent is not considerably reduced.

The intermediate retainers 5 are configured with the first and second mounting surfaces 5a and 5b that are at right angles to each other. As indicated by the arrows X, Y, Z, $\alpha$, $\beta$ and $\gamma$ in FIG. 4, the 3-dimensional position and orientation of the lens 3 with respect to the housing 2 can be adjusted independently around each of X, Y and Z axes and $\alpha$, $\beta$ and $\gamma$ rotational directions, by using the intermediate retainers 5.

Suppose that the lens 3 is bonded to the housing 2 via the intermediate retainers 5 by using a UV-curing adhesive agent. The adjustment of the position of the lens 3 to the housing 2 with respect to the X and Z axes can be made by the sliding movement of the lens 3 and the intermediate retainers 5 on the mounting surface 2c of the housing 2. The adjustment of the position of the lens 3 to the housing 2 with respect to the Y axis can be made by the sliding movement of the lens 3 on the first mounting surfaces 5a of the intermediate retainers 5. Similarly, the adjustment of the orientation of the lens 3 to the housing 2 with respect to each of the $\alpha$, $\beta$ and $\gamma$ rotational directions can be made by the sliding movement of the lens 3 on the first mounting surfaces 5a of the intermediate retainers 5. The main lens surface of the lens 3 is normally configured into a spherical surface, and it is unnecessary to make the adjustment of the orientation of the lens 3 to the housing 2 with respect to the $\gamma$ rotational direction.

Figure 5:
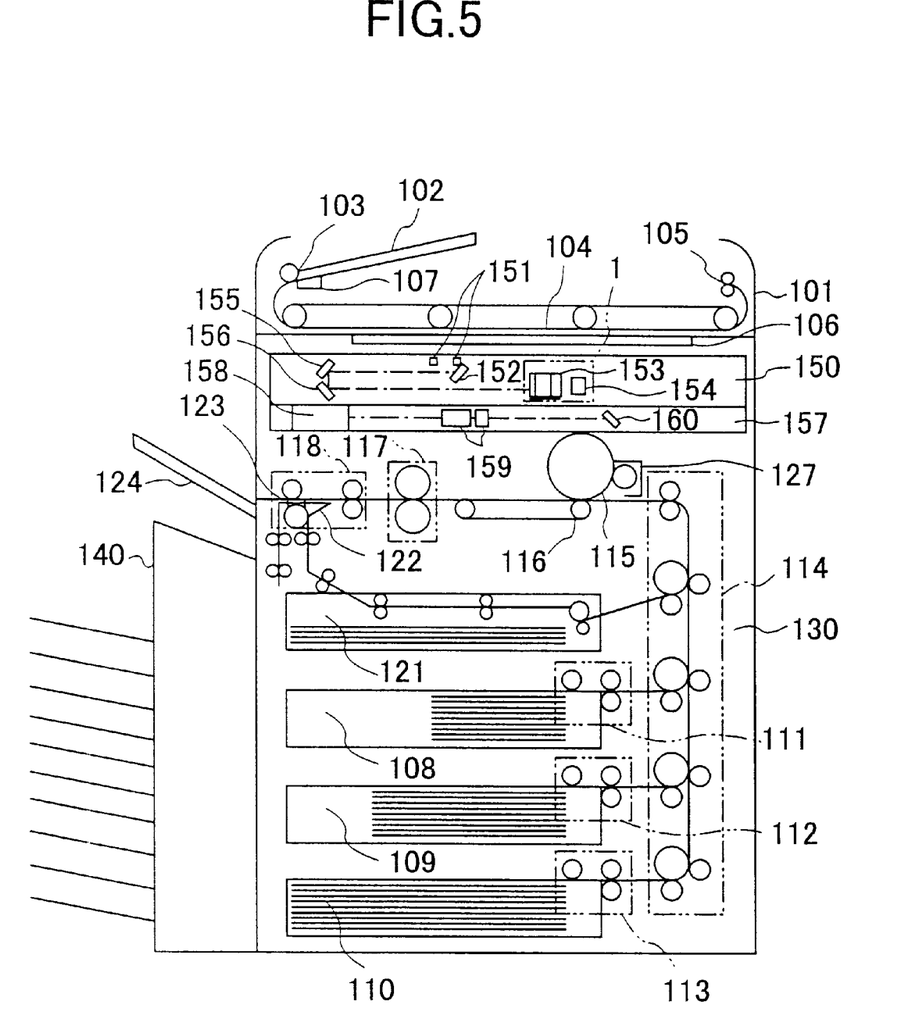
FIG. 5 is a diagram showing an image forming system in which an image reading unit including the solid-state imaging device of the invention is provided.

Next, FIG. 5 shows an image forming system in which an image reading unit including one embodiment of the solid-state imaging device of the invention is provided. The image forming system shown in FIG. 5 is an example of a multi-function digital copier to which one embodiment of the present invention is applied.

As shown in FIG. 5, the image forming system generally includes an automatic document feeder 101, an image reader 150, an optical writing unit 157, a paper supply unit 130, and a post-processing unit 140. The automatic document feeder 101 supplies an original document to a contact glass 106 of the image reader 150, and, when the image reading is done, the automatic document feeder 101 ejects the original document out of the contact glass 106.

In the image reader 150, one embodiment of the solid-state imaging device of the present invention is provided as a CCD image sensor 154 that generates an electrical signal through the optoelectronic conversion of the received light. The image reader 150 irradiates the original document on the contact glass 106 with light, and supplies an image signal derived from the signal produced at the CCD image sensor 154, the image signal indicating an image read from the original document.

The image signal is sent from the image reader 150 to the optical writing unit 157. The optical writing unit 157 radiates a laser beam onto a surface of a photoconductor 115 in accordance with the received image signal, and forms an electrostatic latent image on the surface of the photoconductor 115. The latent image on the photoconductor 115 is converted into a toner image with a toner supplied by a developing unit 127.

The paper supply unit 130 includes a plurality of paper cassettes 108, 109 and 110, and a plurality of paper feeding rollers 111, 112 and 113 provided at respective paper cassettes, and a paper transport block 114. The paper cassettes 108, 109 and 110 are respectively provided to contain copy sheets of different sizes for replenishment. Further, in the image forming system, a roller 116 and a fixing unit 117 are provided.

The paper supply unit 130 delivers a copy sheet to an image transfer position of the photoconductor 115. The toner image is transferred from the photoconductor 115 to the copy sheet, the copy sheet is delivered to the fixing unit 117 by the roller 116, and the image is fixed to the copy sheet by means of the fixing unit 117.

Further, in the image forming system, a sheet transport unit 118, a paper holding unit 121, a path selector 122, an ejection roller 123, and an ejection plate 124 are provided. The sheet transport unit 118 is provided to selectively transport the copy sheet, received from the fixing unit 117, to one of the ejection plate 124 and the post-processing unit 140. When none of the functions of the post-processing unit 140 is used, the copy sheet, received from the fixing unit 117, is delivered to the ejection plate 124 by the ejection roller 123 via the path selector 122. When any of the functions of the post-processing unit 140 is used, the copy sheet after the fixing is done is delivered to the paper holding unit 121 by the sheet transport unit 118 via the path selector 122. When the copy sheet is sent from the paper holding unit 121 to the post-processing unit 140, and the post-processing unit 140 performs the desired one of the post-processing functions, such as a sorting function, a staple function, or the like.

The image reader 150 includes, in addition to the contact glass 106, a scanning optical system, and the scanning optical system includes an exposure lamp 151, a first mirror 152, a focusing lens 153, the CCD image sensor 154, a second mirror 155, and a third mirror 156. The exposure lamp 151 and the first mirror 152 are secured to a first carriage (not shown), and the second mirror 155 and the third mirror 156 are secured to a second carriage (not shown). When optically reading an image from the original document, the first carriage and the second carriage are mechanically driven by a scanner control motor (not shown) in a controlled manner so as not to vary the optical path of the light from the exposure lamp 151.

As described above, the CCD image sensor 154 is provided as one embodiment of the solid-state imaging device of the present invention, and the CCD image sensor 154 generates an electrical signal through the optoelectronic conversion of the received light. The image reading unit 1, which is described above with reference to FIG. 4, corresponds to the block including the focusing lens 153 and the CCD image sensor 154 as indicated by the dotted line in FIG. 5. The image reader 150 supplies the image signal, derived from the signal produced at the CCD image sensor 154, to the optical writing unit 157.

In the image reader 150, by moving the image reading unit 1 (the block including the focusing lens 153 and the CCD image sensor 154) in one of the right and left directions in FIG. 5, it is possible to vary the magnification factor of a resulting image on the copy sheet. If the magnification factor is specified by the operator, the movement of the block including the focusing lens 153 and the CCD image sensor 154 in one of the right and left directions in FIG. 5 is controlled so that the image reading unit 1 is moved to a position so as to meet the specified magnification factor.

The optical writing unit 157 includes a laser output unit 158, a focusing lens 159, and a mirror 160. In the laser output unit 158, a laser diode is provided as the laser light source to emit a laser beam, and a polygonal mirror is also provided therein. The laser diode emits the laser beam in accordance with imaging information output by a control unit (not shown) of the image forming system.

The polygonal mirror having reflection surfaces on the periphery thereof is rotated at a high, constant rotation speed by a mirror motor. One of the reflection surfaces of the rotated polygonal mirror deflects the laser beam, emitted by the laser diode, to the focusing lens 159. The focusing lens 159 converts the emitted laser beam from the laser diode into a convergent laser beam. The convergent laser beam is reflected by the mirror 160 to the surface of the photoconductor 115. Hence, the surface of the photoconductor 115 is scanned in the main scanning direction by the laser beam output by the optical writing unit 157.

The photoconductor 115 is rotated around the rotation axis of the photoconductor 115 in the sub-scanning direction every time one main scanning is made on the photoconductor surface by the laser beam. The direction of the main scanning that is made by the laser beam output by the optical writing unit 157 is parallel to the axial direction of the photoconductor 115, and the sub-scanning direction is perpendicular to the axial direction of the photoconductor 115. The main scanning of the laser beam on the photoconductor surface is repeatedly performed at a given cycle that is suited to the photoconductor rotation speed and the image recording density. Hence, the electrostatic latent image is formed on the surface of the photoconductor 115 by the repetition of the main scanning operations.

Further, in the image forming system, a beam sensor (not shown) is provided at an end location outside the surface of the photoconductor 115. Each time the main scanning is made on the photoconductor surface, the beam sensor receives the laser beam output by the optical writing unit 157 and outputs a line sync signal. In the image forming system, based on the line sync signal output by the beam sensor, the timing of the image recording signal with respect to the main scanning direction and the input/output of the image signal are controlled by the control unit.

Further, in the image forming system, the automatic document feeder 101 includes a document setting plate 102, a roller 103, a transport belt 104, a set of rollers 105, and a path selector 107. When an original document is placed on the document setting plate 102 by the operator, the original document is delivered from the document setting plate 102 to the contact glass 106 by means of the rollers 103 and 105, the transport belt 104 and the path selector 107.

In the above-described embodiments, the raised portion 71a is provided on the glass substrate 71 or the raised portion 75b is provided on the CCD bare chip (the image sensor) 75. The present invention is not limited to these embodiments. Alternatively, both the raised portion 71a and the raised portion 75b may be provided on the glass substrate 71 and the image sensor 75.

In the above-described embodiment of FIG. 4, the housing 2 and the focusing lens 3, 6 are provided in the image reading unit 1. The present invention is not limited to this embodiment. Alternatively, the solid-state imaging device of the present invention is applicable to an image reading unit of another type, for example, a conventional image reading unit in which the focusing lens is mounted on a V-block on a mirror cylinder, and the positional relationship between the focusing lens and the imaging device is adjusted with the movement of the mirror cylinder.

The present invention is not limited to the above-described embodiments, and variations and modifications may be made without departing from the scope of the present invention.

Further, the present invention is based on Japanese priority application No. 2000-190576, filed on Jun. 26, 2000, and Japanese priority application No. 2000-190577, filed on Jun. 26, 2000, the entire contents of which are hereby incorporated by reference.

What is claimed is:

1. A method of production of a solid-state imaging device, comprising the steps of providing a solid-state image sensor having an effective light-receiving region on a circuit formation surface provided in a face-down condition;

providing a transparent substrate having a conductor pattern provided thereon to confront the circuit formation surface of the image sensor;

providing a plurality of bumps on one of the image sensor and the substrate;

supplying a predetermined amount of a transparent adhesive agent between the image sensor and the substrate, the amount of the adhesive agent being large enough to fully cover the light-receiving region of the image sensor;

moving the image sensor closer to the substrate until a predetermined distance between the image sensor and the substrate is reached, so that the bumps interconnect the image sensor and the conductor pattern of the substrate;

forming the adhesive agent between the image sensor and the substrate into a thin layer, the thin layer of the adhesive agent covering the light-receiving region of the image sensor; and curing the adhesive agent.

2. The method of production according to claim 1, wherein the curing of the adhesive agent is performed by irradiating the adhesive agent with ultraviolet rays.

3. The method of production according to claim 1, wherein the adhesive agent after the curing step is performed remains transparent.

4. The method of production according to claim 1, wherein the amount of the adhesive agent supplied is larger than a volume defined by a product of a thickness of the adhesive agent and a surface area of the light-receiving region of the image sensor.

5. The method of production according to claim 1, wherein, in the forming step, pressure is exerted on the adhesive agent such that the adhesive agent is uniformly dispersed over the light-receiving region of the image sensor.

6. The method of production according to claim 1, further comprising the steps of:

providing a sealing resin at outer locations of the bumps between the image sensor and the substrate to enclose an entire periphery of the light-receiving region of the image sensors surrounded by the bumps; and curing the sealing resin.

7. The method of production according to claim 6, wherein the sealing resin is made of an opaque resin material.

8. A method of production of a solid-state imaging device, comprising the steps of:

providing a solid-state image sensor having an effective light-receiving region on a circuit formation surface provided in a face-down condition;

providing a transparent substrate having a conductor pattern provided thereon to confront the circuit formation surface of the image sensor;

providing a plurality of bumps on one of the image sensor and the substrate;

moving the image sensor closer to the substrate until a predetermined distance between the image sensor and the substrate is reached, so that the bumps interconnect the image sensor and the conductor pattern of the substrate;

supplying a predetermined amount of a transparent adhesive agent between the image sensor and the substrate after the predetermined distance is reached in the moving step, the amount of the adhesive agent being large enough to fully cover the light-receiving region of the image sensor;

forming the adhesive agent between the image sensor and the substrate into a thin layer, the thin layer of the adhesive agent covering the light-receiving region of the image sensor; and curing the adhesive agent.

9. The method of production according to claim 8, wherein the curing of the adhesive agent is performed by irradiating the adhesive agent with ultraviolet rays.

10. The method of production according to claim 8, wherein the adhesive agent after the curing step is performed remains transparent.

11. The method of production according to claim 8, wherein the amount of the adhesive agent supplied is larger than a volume defined by a product of a thickness of the adhesive agent and a surface area of the light-receiving region of the image sensor.

12. The method of production according to claim 8, wherein, in the forming step, pressure is exerted on the adhesive agent such that the adhesive agent is uniformly dispersed over the light-receiving region of the image sensor.

13. The method of production according to claim 8, further comprising the steps of providing a sealing resin at outer locations of the bumps between the image sensor and the substrate to enclose an entire periphery of the light-receiving region of the image sensor surrounded by the bumps; and curing the sealing resin.

14. The method of production according to claim 13, wherein the sealing resin is made of an opaque resin material.

* * * * *